(12) United States Patent
Tonari et al.

(10) Patent No.: US 12,744,188 B2
(45) Date of Patent: Sep. 22, 2026

(54) ETCHING METHOD

(71) Applicant: ULVAC, INC., Chigasaki (JP)

(72) Inventors: Kazuhiko Tonari, Chigasaki (JP); Youhei Ono, Chigasaki (JP); Jinhyeok Son, Pyeongtaek Si (KR); Jun-chang Park, Pyeongtaek-Si (KR); Hyunhwa Lee, Pyeongtaek-Si (KR); Jinju Bae, Pyeongtaek-Si (KR)

(73) Assignee: ULVAC, INC., Chigasaki (JP)

( * ) Notice: Subject to any disclaimer, the term of this patent is extended or adjusted under 35 U.S.C. 154(b) by 213 days.

(21) Appl. No.: 18/794,829

(22) Filed: Aug. 5, 2024

(65) Prior Publication Data

US 2025/0054731 A1 Feb. 13, 2025

(30) Foreign Application Priority Data

Aug. 10, 2023 (JP) ................................ 2023-130944

(51) Int. Cl.
*H01J 37/32* (2006.01)
*H10P 50/28* (2026.01)

(52) U.S. Cl.
CPC ........ *H01J 37/3244* (2013.01); *H10P 50/283* (2026.01); *H01J 2237/334* (2013.01)

(58) Field of Classification Search
None
See application file for complete search history.

(56) References Cited

U.S. PATENT DOCUMENTS

2013/0306599 A1* 11/2013 Inoue ...................... B44C 1/227 156/345.36
2023/0128868 A1* 4/2023 Murakami ........ H01J 37/32449 216/67

FOREIGN PATENT DOCUMENTS

JP 2011-96937 A 5/2011

* cited by examiner

*Primary Examiner* — Roberts P Culbert
(74) *Attorney, Agent, or Firm* — Schwegman Lundberg & Woessner, P.A.

(57) ABSTRACT

An etching method includes generating reactive plasma containing hydrogen and nitrogen in a discharge tube having an inner surface formed from an inorganic oxide and supplying the reactive plasma to a processing chamber connected to the discharge tube, and generating a precursor containing fluorine and hydrogen in the processing chamber using the reactive plasma and a gas containing fluorine and supplying the precursor to an etching subject arranged in the processing chamber. The etching method includes supplying hydrogen plasma to the inner surface of the discharge tube in which the reactive plasma was generated, and supplying oxygen plasma to the inner surface to which the hydrogen plasma was supplied.

7 Claims, 3 Drawing Sheets

ETCHING METHOD

CROSS-REFERENCE TO RELATED APPLICATIONS

This application is based upon and claims the benefit of priority from prior Japanese Patent Application No. 2023-130944, filed on Aug. 10, 2023, the entire contents of which are incorporated herein by reference.

TECHNICAL FIELD

The following description relates to an etching method.

BACKGROUND

An etching device is a device that can remove a natural oxide film from a silicon substrate. Some etching devices use radicals contained in plasma, the radicals being generated by the emission of microwaves, to form an etchant that reacts with the natural oxide film. When forming the etchant, a gas used to generate plasma can be supplied to a discharge tube having an inner surface formed from an inorganic oxide. Then, the discharge tube can be irradiated with microwaves so that plasma is generated in the discharge tube. Japanese Laid-Open Patent Publication No. 2011-096937 describes an example of an etching device that heats a silicon substrate to vaporize the complexes formed from the etchant and the natural oxide film.

SUMMARY

A nitrogen-containing gas, such as ammonia gas, is used to generate the plasma for generating the etchant. When plasma is generated from the nitrogen-containing gas in the discharge tube formed from an inorganic oxide, such as sapphire or quartz, the inner surface of the discharge tube becomes nitrided. As a result, the nitriding of the inner surface reduces the characteristics of the plasma generated in the discharge tube that contribute to the generation of a precursor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an etching method includes generating a reactive plasma containing hydrogen and nitrogen in a discharge tube having an inner surface formed from an inorganic oxide, and supplying the reactive plasma to a processing chamber connected to the discharge tube; generating a precursor containing fluorine and hydrogen in the processing chamber using the reactive plasma and a gas containing fluorine, and supplying the precursor to an etching subject arranged in the processing chamber; supplying a hydrogen plasma to the inner surface of the discharge tube in which the reactive plasma was generated; and supplying an oxygen plasma to the inner surface to which the hydrogen plasma was supplied.

The etching method reduces the inner surface of the discharge tube, which is nitrided by the generation of the reactive plasma, through modification by the hydrogen plasma. Then, the inner surface reduced by the hydrogen plasma is oxidized by the oxygen plasma. This returns the inner surface formed from an inorganic oxide to the pre-nitriding state. As a result, the properties of the inner surface of the discharge tube become stable, thereby stabilizing the characteristics of the reactive plasma. Such stabilization of the characteristics of the reactive plasma minimizes a decrease in the etching amount.

Other features and aspects will be apparent from the following detailed description, the drawings, and the claims.

BRIEF DESCRIPTION OF THE DRAWINGS

FIG. 5 is a graph illustrating the relationship of a slot number and the etching amount in Evaluation 2.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

An embodiment of an etching method will now be described with reference to FIGS. 1 to 5.

Etching Device

Figures 1, 2:
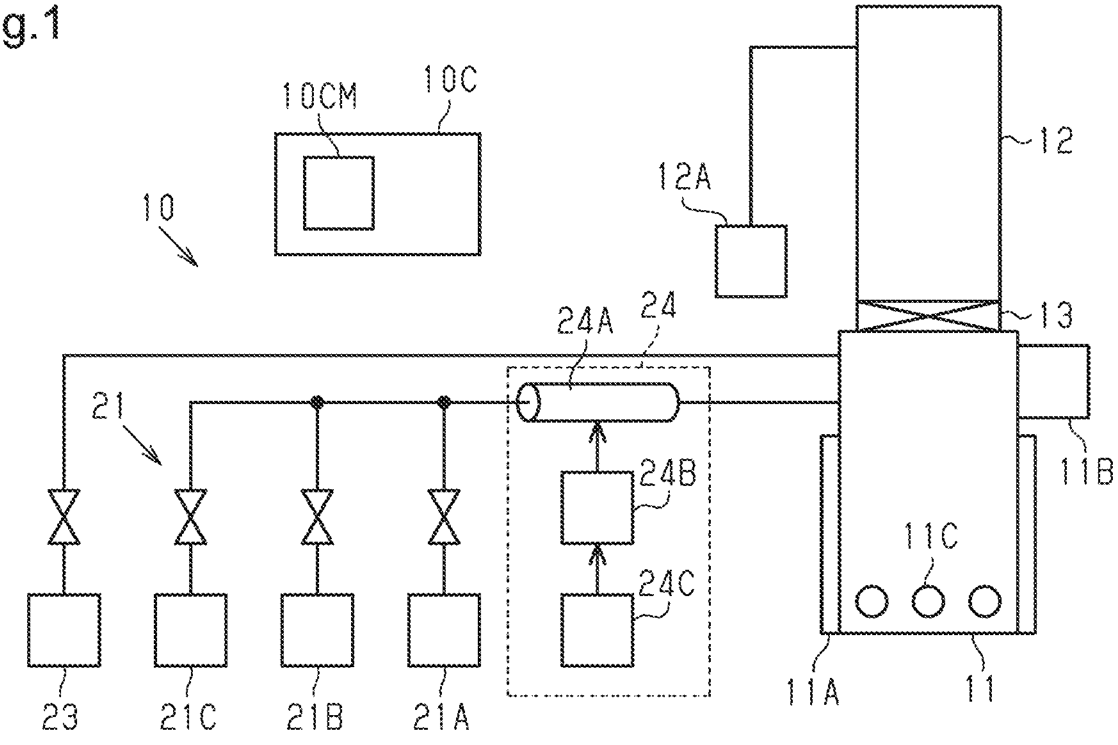
FIG. 1 is a diagram illustrating the configuration of an etching device.
FIG. 2 is a diagram illustrating the configuration of an etching chamber of the etching device illustrated in FIG. 1.

As illustrated in FIG. 1, an etching device 10 includes an etching chamber 11, a load lock chamber 12, and a gate valve 13. The etching device 10 includes a gas mixture supplying unit 21, a fluorine-containing gas supplying unit 23, and a plasma supplying unit 24. The etching device 10 includes a controller 10C.

The etching chamber 11 includes an accommodation space where a substrate S (refer to FIG. 2), which is an example of an etching subject, is accommodated. The etching chamber 11 etches a silicon oxide film on the substrate S in the accommodation space. The load lock chamber 12 loads a pre-etched substrate S into the etching chamber 11. The load lock chamber 12 then unloads the etched substrate S out of the etching chamber 11.

The gate valve 13 is located between the etching chamber 11 and the load lock chamber 12. The gate valve 13 opens and connects the etching chamber 11 and the load lock chamber 12. The gate valve 13 closes and separates the etching chamber 11 from the load lock chamber 12.

The load lock chamber 12 is connected to a coolant gas supplying unit 12A. The coolant gas supplying unit 12A supplies coolant gas to the load lock chamber 12. The coolant gas is an inert gas used to cool the etched substrate S.

The etching chamber 11 includes a first heater 11A, a vent 11B, and a second heater 11C. The first heater 11A heats the etching chamber 11. The vent 11B reduces the pressure of the etching chamber 11 to a predetermined pressure. The second heater 11C heats the substrate S that is accommodated in the etching chamber 11. The etching chamber 11 is an example of a processing chamber.

The etching chamber 11 is connected to the fluorine-containing gas supplying unit 23 and the plasma supplying unit 24. The fluorine-containing gas supplying unit 23 supplies fluorine-containing gas to the accommodation space of the etching chamber 11 where the substrate S is accommodated. An example of the fluorine-containing gas is nitrogen trifluoride gas. The plasma supplying unit 24 supplies reactive plasma to the accommodation space in the etching chamber 11 where the substrate S is accommodated.

The plasma supplying unit 24 includes a discharge tube 24A, a waveguide 24B, and a microwave source 24C. The microwave source 24C emits microwaves through the waveguide 24B to the discharge tube 24A. The discharge tube 24A is connected to the gas mixture supplying unit 21. The discharge tube 24A includes an inner surface formed from an inorganic oxide. The inorganic oxide forming the inner surface of the discharge tube 24A may be a silicon oxide or an aluminum oxide. The discharge tube 24A can be, for example, a quartz tube.

The gas mixture supplying unit 21 supplies the discharge tube 24A with a first gas mixture containing hydrogen atoms and nitrogen atoms. Further, the gas mixture supplying unit 21 supplies the discharge tube 24A with a second gas mixture containing hydrogen atoms and oxygen atoms. Alternatively, the gas mixture supplying unit 21 supplies the discharge tube 24A with a gas containing hydrogen atoms and then a gas containing oxygen atoms.

The gas mixture supplying unit 21 includes a nitrogen-containing gas supplying unit 21A, a hydrogen-containing gas supplying unit 21B, and an oxygen-containing gas supplying unit 21C. An example of the nitrogen-containing gas is nitrogen gas. An example of the hydrogen-containing gas is ammonia gas. The hydrogen-containing gas may be hydrogen gas. An example of the oxygen-containing gas is oxygen gas. The oxygen-containing gas may be gas of an oxygen compound. The oxygen compound may be, for example, water or a nitrogen-oxygen compound.

The plasma supplying unit 24 generates reactive plasma in the discharge tube 24A by irradiating the first gas mixture in the discharge tube 24A with microwaves. The reactive plasma contains hydrogen radicals, nitrogen radicals, and hydronitrogen radicals. In the etching chamber 11, a precursor containing fluorine atoms and hydrogen atoms is generated from the reactive plasma and the fluorine-containing gas. This supplies the precursor to the substrate S.

The plasma supplying unit 24 generates hydrogen plasma in the discharge tube 24A by irradiating a hydrogen-containing gas in the discharge tube 24A with microwaves. The hydrogen plasma contains hydrogen atoms or hydrogen molecules in the plasma state that cut the bonds between inorganic atoms and nitrogen atoms in the inorganic nitride, in which the inorganic oxide is nitrided. The hydrogen plasma may be generated from hydrogen gas. The hydrogen plasma may be formed by hydrogen atoms in the plasma state. The hydrogen plasma may contain hydrogen molecules in the plasma state. The hydrogen plasma may be generated from ammonia gas. The hydrogen plasma may contain hydrogen atoms in the plasma state and hydronitrogen in the plasma state.

The plasma supplying unit 24 generates oxygen plasma in the discharge tube 24A by irradiating an oxygen-containing gas in the discharge tube 24A with microwaves. The oxygen plasma contains oxygen atoms in the plasma state, oxygen molecules in the plasma state, ozone, or an oxygen compound in the plasma state that oxidizes the inorganic nitride, which is reduced by the hydrogen atoms in the plasma state, back to the inorganic oxide. The oxygen compound may be water or a nitrogen-oxygen compound. The oxygen plasma may be generated from oxygen gas. The oxygen plasma may be formed by oxygen atoms in the plasma form. The oxygen plasma may contain oxygen molecules in the plasma form. The oxygen plasma may contain ozone. The oxygen plasma may be generated from an oxygen compound. The oxygen plasma may contain oxygen atoms in the plasma state and an oxygen compound in the plasma state.

The plasma supplying unit 24 generates modification plasma in the discharge tube 24A by irradiating the second gas mixture in the discharge tube 24A with microwaves. The modification plasma includes hydrogen plasma and oxygen plasma.

The modification plasma may be generated in the discharge tube 24A from a gas obtained by adding a trace amount of oxygen to the first gas mixture, which is used to generate reactive plasma containing hydrogen and nitrogen. When the first gas mixture is a gas mixture of ammonia gas and nitrogen gas, the modification plasma may be generated from a gas mixture obtained by adding a trace amount of oxygen gas to the first gas mixture. As a result, the environment in which the substrate S is etched inside the etching chamber 11 becomes similar to the environment in which the inner surface of the discharge tube 24A is modified. This readily stabilizes the state of the plasma during etching as compared to when these environments largely differ from each other. The flow rate of the trace amount of oxygen gas may be in a range of 0.5% to 10%, inclusive, of the flow rate of the gas for generating hydrogen plasma. Alternatively, the flow rate of the trace amount of oxygen gas may be in a range of 1% to 10%, inclusive, of the flow rate of the gas for generating hydrogen plasma. The flow rate of the trace amount of oxygen gas may be in a range of 0.5% to 10%, inclusive, of the flow rate of the ammonia gas for generating hydrogen plasma. Alternatively, the flow rate of the trace amount of oxygen gas may be in a range of 1% to 10%, inclusive, of the flow rate of the ammonia gas for generating hydrogen plasma.

The controller 10C includes a memory 10CM. The memory 10CM stores processing conditions for etching a silicon oxide film. The processing conditions include the pressure of the etching chamber 11, the temperature of the substrate S, the flow rate of each gas, and the output of the microwave source 24C. The controller 10C controls and drives the first heater 11A, the vent 11B, the second heater 11C, the gas mixture supplying unit 21, the fluorine-containing gas supplying unit 23, and the plasma supplying unit 24 so that the etching conditions match the processing conditions.

Etching Chamber 11

As illustrated in FIG. 2, the etching chamber 11 accommodates a support 10A. The support 10A is configured to support a plurality of substrates S. The substrates S supported by the support 10A are arranged one over another with a gap extending between adjacent ones of the substrates S. Each substrate S includes a silicon oxide film. An example of the substrate S is a disc-shaped silicon substrate.

The etching chamber 11 includes a shower head 11D. The shower head 11D is connected to the discharge tube 24A. Any number of discharge tubes 24A may be connected to the shower head 11D. FIG. 2 shows an example in which two discharge tubes 24A are connected to the shower head 11D. The shower head 11D includes nozzles. The nozzles of the shower head 11D are arranged one over another in the direction in which the substrates S are arranged. The plasma supplied from the discharge tubes 24A is expelled from the nozzles of the shower head 11D toward the substrates S.

The etching chamber 11 includes a rotor 11E. The rotor 11E rotates the support 10A in the circumferential direction of the substrate S. The rotor 11E disperses the plasma expelled from the shower head 11D toward the substrates S and the fluorine-containing gas delivered from the fluorine-containing gas supplying unit 23 toward the substrates S in the circumferential direction of the substrate S. In this manner, the precursor is supplied from the periphery of the substrates S into the gaps extending between the adjacent one of the substrates S in the etching chamber 11.

The etching chamber 11 includes a thermometer 11F. The thermometer 11F measures the temperature inside the etching chamber 11 as the temperature of the substrate S. The thermometer 11F is connected to the controller 10C. The temperature measured by the thermometer 11F is input to the controller 10C. The controller 10C controls and drives the first heater 11A and the second heater 11C based on the measurement of the thermometer 11F.

Etching Method

The etching method includes supplying reactive plasma to the processing chamber, supplying a precursor to the etching subject, supplying hydrogen plasma, and supplying oxygen plasma. When supplying reactive plasma to the processing chamber, reactive plasma containing hydrogen and nitrogen is generated in the discharge tube having the inner surface formed from an inorganic oxide, and the reactive plasma is supplied to the processing chamber connected to the discharge tube. When supplying a precursor, a precursor containing fluorine and hydrogen is generated in the processing chamber using the reactive plasma and a gas containing fluorine, and the precursor is supplied to the etching subject arranged in the processing chamber. When supplying hydrogen plasma, hydrogen plasma is supplied to the inner surface of the discharge tube, in which the reactive plasma was generated, in a state in which the etching subject is absent from the processing chamber. When supplying oxygen plasma, oxygen plasma is supplied to the inner surface of the discharge tube, to which the hydrogen plasma was supplied.

The etching method in accordance with the present disclosure reduces the inner surface of the discharge tube, which is nitrided by the generation of the reactive plasma, through modification by the hydrogen plasma. Then, the inner surface reduced by the hydrogen plasma is oxidized by the oxygen plasma. This returns the inner surface formed from an inorganic oxide to the pre-nitriding state. As a result, the properties of the inner surface of the discharge tube become stable, thereby stabilizing the characteristics of the reactive plasma. Such stabilization of the characteristics of the reactive plasma minimizes a decrease in the etching amount. The etching method will now be described in more detail with reference to the drawings.

Figure 3:
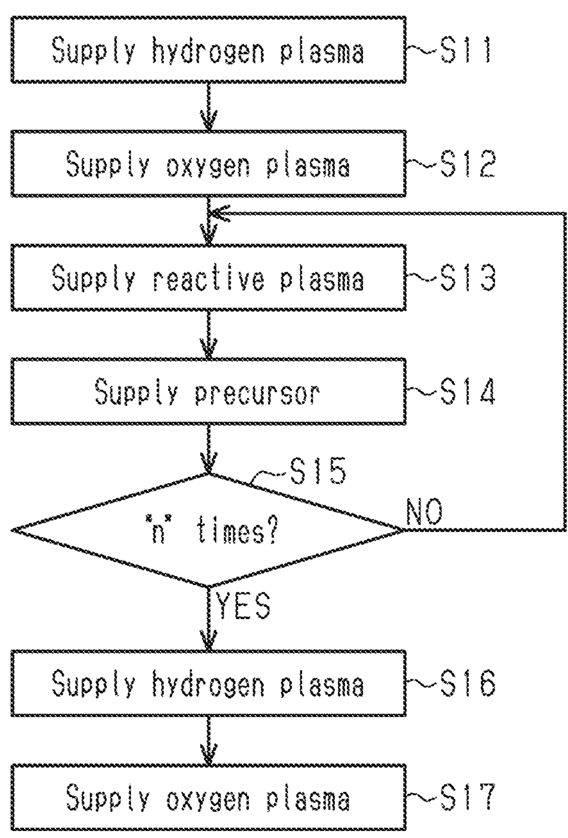
FIG. 3 is a flowchart illustrating the processing procedure of an etching method.

As illustrated in FIG. 3, the etching method includes a hydrogen plasma supplying step (step S11) and an oxygen plasma supplying step (step S12). In the hydrogen plasma supplying step, hydrogen plasma is supplied to the inner surface of the discharge tube 24A. In the oxygen plasma supplying step, oxygen plasma is supplied to the inner surface of the discharge tube 24A to which hydrogen plasma was supplied.

The hydrogen plasma supply step and the oxygen plasma supply step may be performed separately. Specifically, the supply of the oxygen plasma to the inner surface of the discharge tube 24A may be started after the supply of the hydrogen plasma to the inner surface of the discharge tube 24A is ended.

Alternatively, the hydrogen plasma supply step and the oxygen plasma supply step may be performed simultaneously. Specifically, a hydrogen-containing gas and an oxygen-containing gas may be simultaneously supplied to the discharge tube 24A, and then hydrogen plasma and oxygen plasma may be generated in the discharge tube 24A from the hydrogen-containing gas and the oxygen-containing gas. In this case, the hydrogen plasma and the oxygen plasma are supplied to the inner surface of the discharge tube 24A at substantially the same time. The inner surface reduced by the hydrogen plasma will be oxidized without requiring an environment or time for maintaining the reduced state. This simplifies a step of returning the nitrided inner surface to the pre-nitriding state, and shortens the time required to return the nitrided inner surface to the pre-nitriding state.

In the hydrogen plasma supplying step, the hydrogen plasma may be generated in the discharge tube 24A from hydrogen gas or ammonia gas supplied to the discharge tube 24A. In the oxygen plasma supplying step, the oxygen plasma may be generated in the discharge tube 24A from oxygen gas or water supplied to the discharge tube 24A. Such configurations minimize a decrease in the etching amount more effectively.

The etching method includes a reactive plasma supplying step (step S13) and a precursor supplying step (step S14) that are performed after the hydrogen plasma supplying step and the oxygen plasma supplying step. In the reactive plasma supplying step, the reactive plasma generated in the discharge tube 24A is supplied to the etching chamber 11. In the precursor supply step, a precursor is generated in the etching chamber 11 from the reactive plasma supplied to the etching chamber 11 and a fluorine-containing gas supplied to the etching chamber 11. Then, the generated precursor is supplied to the substrate S accommodated in the etching chamber 11. Accordingly, the reaction of the silicon dioxide film on the substrate S with the precursor yields a reaction product on the substrate S. The reaction product has a higher volatility than the silicon oxide film.

In the precursor supply step, as described above, the precursor is supplied from the periphery of the substrates S, each including the silicon oxide film, into the gaps extending between the adjacent ones of the substrates S. When a plurality of substrates S are simultaneously etched in the same etching chamber 11, a decrease in the etching amount in each etching process affects the processing results of all the substrates S. Thus, it is more strongly desired that the etching amount have minimal fluctuations over a number of etching processes when a plurality of substrates S are etched simultaneously in the same etching chamber 11, as compared to when a single substrate S is etched in each etching process. In this respect, the etching method of the present embodiment minimizes a decrease in the etching amount when a plurality of substrates S are etched in the same etching chamber 11. Therefore, it is particularly advantageous to supply hydrogen plasma and oxygen plasma to the inner surface of the discharge tube 24A.

The reactive plasma supplying step and the precursor supplying step are performed only a predetermined number of times. The reactive plasma supply step and the precursor supply step may be performed once or twice or more. When the reactive plasma supplying process and the precursor supplying process are performed a predetermined number of times (step S15: YES), the hydrogen plasma supplying process (step S16) is performed, and then, the oxygen plasma supplying process (step S17) is performed.

In the hydrogen plasma supplying step of step S16, hydrogen plasma is supplied to the inner surface of the discharge tube 24A, in the same manner as the hydrogen plasma supplying step of step S11 described above. In the oxygen plasma supplying step of step S17, oxygen plasma is supplied to the inner surface of the discharge tube 24A to which hydrogen plasma was supplied, in the same manner as the oxygen plasma supplying step of step S12 described above.

The hydrogen plasma supply step and the oxygen plasma supply step may be performed separately. Specifically, the supply of the oxygen plasma to the inner surface of the discharge tube 24A may be started after the supply of the hydrogen plasma to the inner surface of the discharge tube 24A is ended. Alternatively, the hydrogen plasma supply step and the oxygen plasma supply step may be performed simultaneously.

In this manner, in the etching method, hydrogen plasma and oxygen plasma are supplied only once whenever the reactive plasma is generated in the discharge tube 24A a predetermined number of times. As a result, the inner surface of the discharge tube 24A is modified through reduction and oxidation whenever the reactive plasma is generated a predetermined number of times. This further stabilizes the characteristics of the reactive plasma.

Also, in the etching method, hydrogen plasma and oxygen plasma are supplied before and after reactive plasma is generated in the discharge tube 24A a predetermined number of times. This also stabilizes the characteristics of the reactive plasma.

The hydrogen plasma supplying step (step S11) and the oxygen plasma supplying step (step S12) before the reactive plasma supplying step do not have to be performed. Nonetheless, when steps S11 and S12 are performed, regardless of the length of period from when step S12 is completed to when step S13 is performed, the environment inside the etching chamber 11 remains substantially constant when step S13 is performed. This further minimizes a change in the etched amount of the silicon oxide film.

EXAMPLES

Example 1

The etching device 10 was prepared in which two quartz tubes, serving as discharge tubes 24A, were connected to the etching chamber 11. Each of the discharge tubes 24A was connected to the gas mixture supplying unit 21. The discharge tubes 24A underwent the modification process whenever a single process of etching was performed on the substrates S in the etching device 10. In other words, "n" in FIG. 3 was set to "1". In the modification process of the discharge tube 24A, a hydrogen-containing gas and an oxygen-containing gas were simultaneously supplied, and then modification plasma was generated from the hydrogen-containing gas and the oxygen-containing gas. In this case, the gases supplied to each discharge tube 24A and the flow rates of the gases were set as follows.

Modification Process Condition

Ammonia gas (hydrogen-containing gas): 1300 sccm

Oxygen-containing gas: 9 sccm

Nitrogen gas: 3900 sccm

Comparative Example 1

The substrates S were etched in the same manner as in Example 1 except that the discharge tubes 24A did not undergo the modification process when etching was performed on the silicon oxide film using the same etching device 10 as in Example 1.

Evaluation 1

Figure 4:
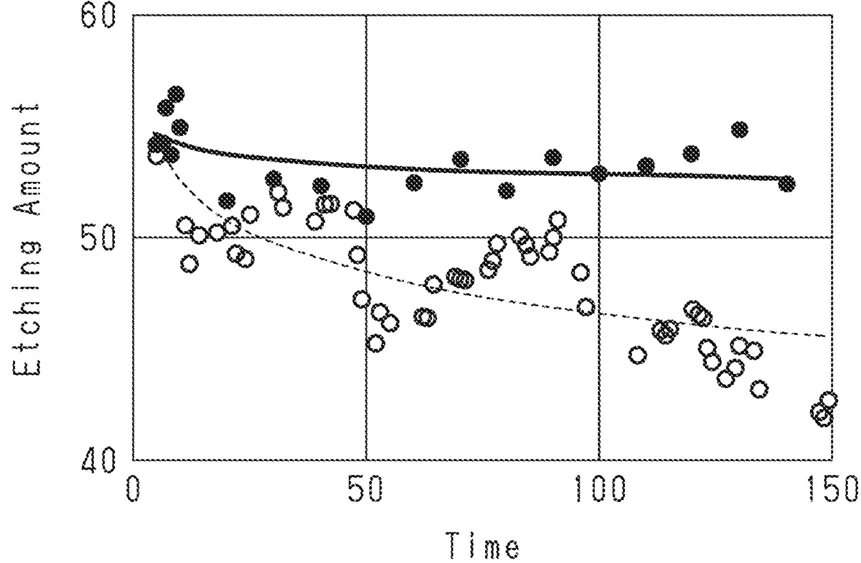
FIG. 4 is a graph illustrating the relationship of an elapsed time and an etching amount in Example 1 and Comparative Example 1.

FIG. 4 shows the measurement results of fluctuations in the etching amount over time. In FIG. 4, the etching amount in Example 1 is indicated by black circles, and the etching amount in Comparative Example 1 is indicated by white circles.

FIG. 4 indicates that the etching amount was relatively stable over a plurality of etching processes in Example 1, in which the discharge tubes 24A were modified, as compared with Comparative Example 1, in which the discharge tubes 24A were not modified.

Evaluation 2

Figure 5:
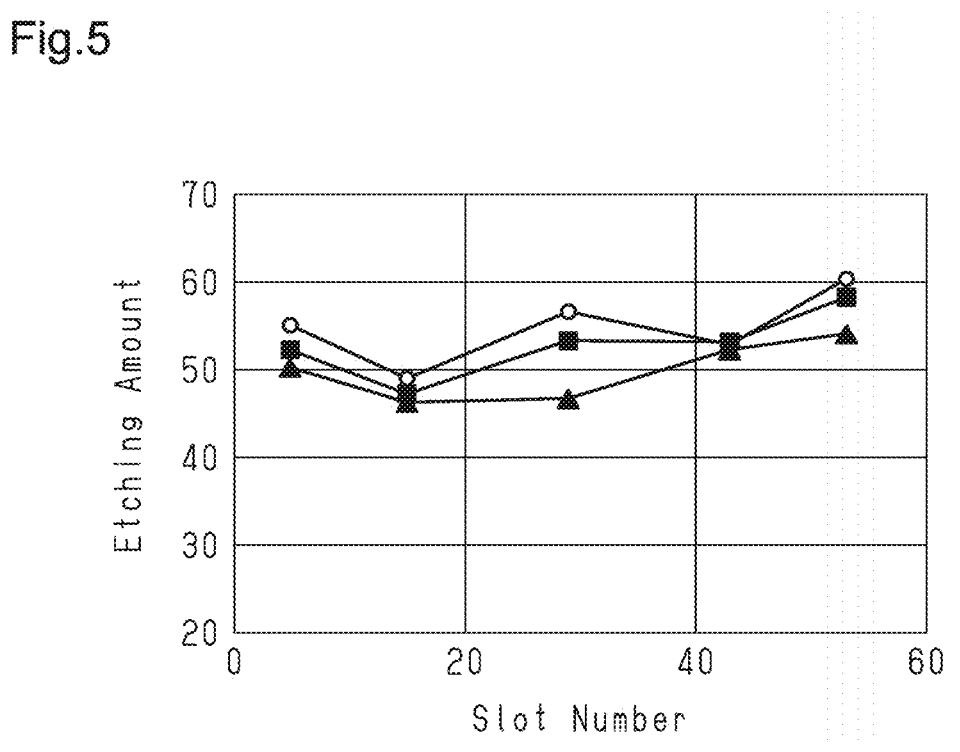

In the etching device 10 used in Example 1, the etching amount of the substrate S was measured for each slot number in the support 10A. Specifically, the etching amount was measured three times; namely, at the initial etching, at a time point after several times of etching and before the modification process, and at a time point after several times of etching and after the modification process. In FIG. 5, the etching amount measured at the initial etching is indicated by white circles, the etching amount measured before the modification process is indicated by black triangles, and the etching amount measured after the modification process is indicated by black squares.

FIG. 5 indicates that the etching amount largely recovered after the modification process at a position of the stacked substrates where the decrease in the etching amount was relatively large. Further, the recovery of the etching amount after the modification process was relatively small at a position of the stacked substrates where the decrease in the etching amount was relatively small. It was also found that as a result of the modification process, the etching amount of the substrate S in every slot was included in a predetermined range.

The etching method in accordance with the embodiment has the following advantages.

(1) The inner surface of the discharge tube 24A nitrided by generation of reactive plasma is reduced through modification by hydrogen plasma. Then, the inner surface reduced by the hydrogen plasma is oxidized by oxygen plasma. This returns the inner surface formed from an inorganic oxide to the pre-nitriding state. This stabilizes the properties of the inner surface of the discharge tube 24A, thereby stabilizing the characteristics of the reactive plasma. Such stabilization of the characteristics of the reactive plasma minimizes a decrease in the etching amount.

(2) The inner surface of the discharge tube 24A is modified through reduction and oxidation whenever the reactive plasma is generated a predetermined number of times. This further stabilizes the characteristics of the reactive plasma.

(3) The inner surface of the discharge tube is modified through reduction and oxidation before and after the reactive plasma is generated a predetermined number of times. This further stabilizes the characteristics of the reactive plasma.

(4) When plasma is generated from the gas mixture containing a hydrogen-containing gas and an oxygen-containing gas, the hydrogen plasma and the oxygen plasma are supplied to the inner surface of the discharge tube 24A at substantially the same time. In this case, the inner surface reduced by the hydrogen plasma will be oxidized without requiring an environment or time for maintaining the reduced state. This simplifies a step of returning the nitrided inner surface to the pre-nitriding state, and shortens the time required to return the nitrided inner surface to the pre-nitriding state.

(5) When a plurality of substrates S are etched in a single etching chamber 11, a decrease in the amount of etching is minimized. Thus, it is particularly advantageous to supply the hydrogen plasma and the oxygen plasma to the inner surface of the discharge tube 24A.

The above embodiment may be changed as described below.

Etching Chamber

The etching chamber 11 does not have to include the first heater 11A or the second heater 11C.

The etching chamber 11 may be connected to an inert gas supplying unit. The inert gas supplying unit supplies the etching chamber 11 with an inert gas, such as nitrogen gas or argon gas, for heating the substrate S.

The etching chamber 11 may be changed to a single-substrate type that etches one substrate S at a time.

Gas

The fluorine-containing gas may be hydrogen fluoride gas, carbon tetrafluoride gas, or silicon tetrafluoride gas. The fluorine-containing gas reacts with the plasma, which is generated from the gas mixture, on the silicon-containing film to form an etchant.

Etching Method

In the modification process, part of the period during which the hydrogen-containing gas for generating the hydrogen plasma is supplied to the discharge tube 24A may overlap part of the period during which the oxygen-containing gas for generating the oxygen plasma is supplied to the discharge tube 24A.

The etching subject may be disposed in the etching chamber 11 when the hydrogen plasma is supplied to the inner surface of the discharge tube 24A and when the oxygen plasma is supplied to the inner surface of the discharge tube 24A.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. An etching method, comprising:

generating a reactive plasma containing hydrogen and nitrogen in a discharge tube having an inner surface formed from an inorganic oxide, and supplying the reactive plasma to a processing chamber connected to the discharge tube;

generating a precursor containing fluorine and hydrogen in the processing chamber using the reactive plasma and a gas containing fluorine, and supplying the precursor to an etching subject arranged in the processing chamber;

supplying a hydrogen plasma to the inner surface of the discharge tube in which the reactive plasma was generated; and supplying an oxygen plasma to the inner surface to which the hydrogen plasma was supplied.

2. The etching method according to claim 1, wherein supplying the hydrogen plasma and supplying the oxygen plasma are performed only once whenever the reactive plasma is generated in the discharge tube a predetermined number of times.

3. The etching method according to claim 1, wherein supplying the hydrogen plasma and supplying the oxygen plasma are performed before the reactive plasma is generated in the discharge tube a predetermined number of times, and wherein supplying the hydrogen plasma and supplying the oxygen plasma are performed after the reactive plasma is generated in the discharge tube the predetermined number of times.

4. The etching method according to claim 1, wherein supplying the oxygen plasma to the inner surface of the discharge tube includes generating the oxygen plasma in the discharge tube from an oxygen gas or water supplied to the discharge tube.

5. The etching method according to claim 1, wherein supplying the hydrogen plasma to the inner surface of the discharge tube includes generating the hydrogen plasma in the discharge tube from a hydrogen gas or an ammonia gas supplied to the discharge tube.

6. The etching method according to claim 1, wherein supplying the hydrogen plasma to the inner surface of the discharge tube and supplying the oxygen plasma to the inner surface of the discharge tube are performed by simultaneously supplying a gas containing hydrogen and a gas containing oxygen to the discharge tube and generating the hydrogen plasma and the oxygen plasma in the discharge tube from the gas containing hydrogen and the gas containing oxygen.

7. The etching method according to claim 1, wherein the etching subject corresponds to silicon substrates, wherein each of the silicon substrates include a silicon oxide film, wherein the processing chamber accommodates the silicon substrates arranged adjacent to one another with a gap extending in between, and wherein supplying of the precursor includes supplying the precursor from a periphery of the silicon substrates into the gap.

* * * * *